US010529733B2

(12) United States Patent
Yamamoto (10) Patent No.: US 10,529,733 B2
(45) Date of Patent: Jan. 7, 2020

(54) SEMICONDUCTOR DEVICE AND METHOD FOR MANUFACTURING THE SAME

(71) Applicant: Toshiba Memory Corporation, Minato-ku (JP)

(72) Inventor: Koichi Yamamoto, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 60 days.

(21) Appl. No.: 15/696,837

(22) Filed: Sep. 6, 2017

(65) Prior Publication Data

US 2018/0277561 A1 Sep. 27, 2018

(30) Foreign Application Priority Data

Mar. 23, 2017 (JP) ................. 2017-057984

(51) Int. Cl.
*H01L 29/792* (2006.01)
*H01L 27/11582* (2017.01)
(Continued)

(52) U.S. Cl.
CPC .... *H01L 27/11582* (2013.01); *H01L 21/0217* (2013.01); *H01L 21/02164* (2013.01); *H01L 21/31053* (2013.01); *H01L 21/76802* (2013.01); *H01L 21/76816* (2013.01); *H01L 21/76829* (2013.01); *H01L 23/5226* (2013.01); *H01L 23/5283* (2013.01); *H01L 23/53295* (2013.01); *H01L 27/11575* (2013.01);
(Continued)

(58) Field of Classification Search
CPC ........... H01L 21/02164; H01L 21/0217; H01L 21/31053; H01L 21/76802; H01L 23/5226; H01L 23/5283; H01L 23/53295; H01L 27/105; H01L 27/11573; H01L 27/11575; H01L 27/11578; H01L 27/11582
USPC .................................. 257/314–324
See application file for complete search history.

(56) References Cited

U.S. PATENT DOCUMENTS 7,799,672 B2  9/2010  Hashimoto et al.
2011/0031546 A1*  2/2011  Uenaka ............ H01L 21/28282
                                                        257/316
(Continued)

FOREIGN PATENT DOCUMENTS

JP    07-135183    5/1995
JP    2010-192646  9/2010
JP    2015-230909  12/2015

*Primary Examiner* — Brook Kebede
(74) *Attorney, Agent, or Firm* — Oblon, McClelland, Maier & Neustadt, L.L.P.

(57) ABSTRACT

According to an embodiment, a semiconductor device includes a substrate, a stacked body, a first insulating film, a second insulating film and a plurality of contacts. The stacked body is provided on the substrate and includes a plurality of electrode films stacked with spacing from each other. An end part of the stacked body is shaped like a staircase in which a terrace is formed in each of the plurality of electrode films. The first insulating film is provided on the end part. The second insulating film is provided on the first insulating film and located along the end part. At least part of the second insulating film extends with inclination. The plurality of contacts extends in a stacking direction of the plurality of electrode films in the first insulating film and the second insulating film and is located on the terraces of the plurality of electrode films.

21 Claims, 12 Drawing Sheets

(51) Int. Cl.
   *H01L 23/528*   (2006.01)
   *H01L 23/522*   (2006.01)
   *H01L 23/532*   (2006.01)
   *H01L 21/02*    (2006.01)
   *H01L 21/3105*  (2006.01)
   *H01L 21/768*   (2006.01)
   *H01L 27/11575* (2017.01)
   *H01L 27/11573* (2017.01)
   *H01L 21/311*   (2006.01)

(52) U.S. Cl.
   CPC .... *H01L 21/31111* (2013.01); *H01L 21/31116* (2013.01); *H01L 21/76877* (2013.01); *H01L 27/11573* (2013.01)

(56) References Cited

U.S. PATENT DOCUMENTS

2011/0169071 A1* 7/2011 Uenaka ............... H01L 27/105
                                                  257/326
2011/0284943 A1* 11/2011 Hwang ............... H01L 27/0207
                                                  257/314

\* cited by examiner

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2017-057984, filed on Mar. 23, 2017; the entire contents of which are incorporated herein by reference.

FIELD

Embodiments of the invention relate generally to a semiconductor device and a method for manufacturing the same.

BACKGROUND

A semiconductor memory device with three-dimensional structure has a structure in which a memory cell array including a plurality of memory cells is integrated with a peripheral circuit. The memory cell array is provided with a stacked body in which a plurality of electrode films is stacked. Memory holes are formed in the stacked body. The end part of the stacked body is processed into a staircase shape. Each electrode film is extracted to the outside of the stacked body through a contact. In such a staircase-shaped end part, with the increase of the number of stacked electrode films, the contact may punch through on the shallow hole side. This causes the problem of poor reliability.

DETAILED DESCRIPTION

According to an embodiment, a semiconductor device includes a substrate, a stacked body, a first insulating film, a second insulating film and a plurality of contacts. The stacked body is provided on the substrate and includes a plurality of electrode films stacked with spacing from each other. An end part of the stacked body is shaped like a staircase in which a terrace is formed in each of the plurality of electrode films. The first insulating film is provided on the end part. The second insulating film is provided on the first insulating film and located along the end part. At least part of the second insulating film extends with inclination. The plurality of contacts extends in a stacking direction of the plurality of electrode films in the first insulating film and the second insulating film and is located on the terraces of the plurality of electrode films.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

First Embodiment

Figure 1:
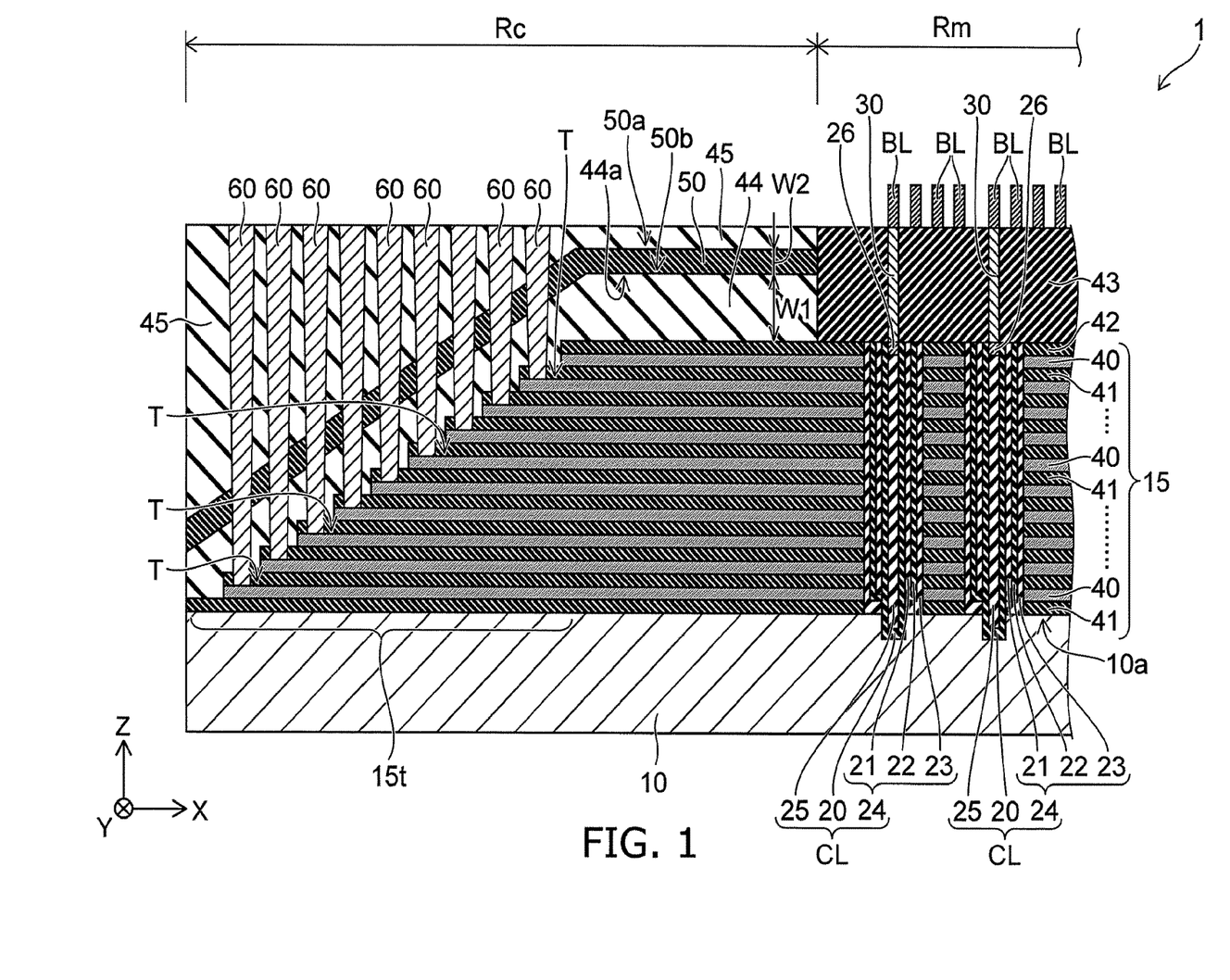
FIG. 1 is a sectional view showing a semiconductor device according to a first embodiment.

FIG. 1 is a sectional view showing a semiconductor device 1.

As shown in FIG. 1, the semiconductor device 1 is provided with a substrate 10. The substrate 10 is a semiconductor substrate and contains silicon (Si) such as monocrystalline silicon.

In this specification, two directions parallel to the upper surface 10a of the substrate 10 and orthogonal to each other are referred to as X-direction and Y-direction. The direction orthogonal to both the X-direction and the Y-direction is referred to as Z-direction.

The semiconductor device 1 is provided with a memory cell region Rm and a staircase region Rc. In the example of FIG. 1, the memory cell region Rm and the staircase region Rc are placed adjacent to each other in the X-direction.

The memory cell region Rm is provided with a stacked body 15 and a plurality of columnar parts CL. The stacked body 15 is provided on the substrate 10 and includes a plurality of electrode films 40 and a plurality of insulating films 41. The stacking direction of the stacked body 15 corresponds to the Z-direction.

For instance, of the plurality of electrode films 40, the lowermost electrode film 40 is a source side select gate, and the uppermost electrode film 40 is a drain side select gate. For instance, of the plurality of electrode films 40, the electrode films 40 provided between the lowermost electrode film 40 (source side select gate) and the uppermost electrode film 40 (drain side select gate) are word lines. Of the plurality of electrode films 40 of the stacked body 15, the uppermost and lowermost electrode films 40 may be dummies not connected to interconnects. The electrode film 40 contains a conductive material. The electrode film 40 contains e.g. metal such as tungsten (W).

The insulating film 41 is provided between the electrode films 40. The insulating film 41 contains e.g. silicon oxide (SiO). On the stacked body 15, an insulating film 42 and an insulating film 43 are provided sequentially in the Z-direction. The insulating films 42, 43 contain e.g. silicon oxide.

The columnar part CL is provided in a plurality in the stacked body 15. The columnar part CL extends in the Z-direction in the stacked body 15 and the insulating film 42. The columnar part CL includes a core part 25, a channel 20, and a memory film 24.

The core part 25 contains e.g. silicon oxide. The core part 25 is shaped like e.g. a circular column. A contact plug 26 formed from e.g. silicon is provided at the upper end of the core part 25. The contact plug 26 is surrounded with the channel 20. The upper end of the contact plug 26 is connected to a contact 30.

The channel 20 is provided around the core part 25. The channel 20 is a semiconductor part and contains e.g. silicon. The channel 20 contains e.g. polysilicon crystallized from amorphous silicon. The channel 20 is shaped like e.g. a tube having a bottom.

The memory film 24 is provided around the channel 20. The memory film 24 includes a tunnel insulating film 21, a charge storage film 22, and a block insulating film 23.

The tunnel insulating film 21 is provided around the channel 20. The tunnel insulating film 21 contains e.g. silicon oxide.

The charge storage film 22 is provided around the tunnel insulating film 21. The charge storage film 22 contains e.g. silicon nitride (SiN). A memory cell including the charge storage film 22 is formed in the crossing portion of the channel 20 and the electrode film 40 (word line).

The block insulating film 23 is provided around the charge storage film 22. For instance, the block insulating film 23 is a silicon oxide film containing silicon oxide, an aluminum oxide film containing aluminum oxide (AlO), or a stacked film thereof.

A plurality of bit lines BL extending in the Y-direction are provided above the columnar part CL. The upper end of the columnar part CL is connected to one of the bit lines BL through a contact 30. The contact 30 extends in the insulating film 43 and contains a conductive material such as metal.

The staircase region Rc is provided with an insulating film 44, an insulating film 50, an insulating film 45, and a contact 60. In the staircase region Rc, the end part 15t of the stacked body 15 is shaped like a staircase in which a terrace T is formed in the electrode film 40. Here, the staircase-shaped structure refers to a structure in which horizontal surfaces (terraces) and vertical surfaces (steps) are placed alternately.

The insulating film 44 is provided on the staircase-shaped end part 15t. For instance, the insulating film 44 covers the end part 15t. The insulating film 44 contains e.g. silicon oxide. The insulating film 44 contains e.g. TEOS (tetraethoxysilane). For instance, the Z-direction thickness W1 of the insulating film 44 located on the insulating film 42 is approximately 300 nanometers.

The insulating film 50 is provided on the insulating film 44. For instance, as shown in FIG. 1, the upper surface 50a and the lower surface 50b of the insulating film 50 are located generally parallel to the upper surface 44a of the insulating film 44. For instance, the upper surface 44a of the insulating film 44 may be formed with minimum asperities (formed smoothly). In this case, such asperities are formed also at the lower surface 50b of the insulating film 50.

The insulating film 50 is located along the staircase-shaped end part 15t so that part of the insulating film 50 extends with inclination. The inclination direction of the insulating film 50 is a direction inclined by a prescribed angle with respect to the direction along the upper surface 10a of the substrate 10 (X-direction in the example of FIG. 1) and the stacking direction of the stacked body 15 (Z-direction in the example of FIG. 1). The insulating film 50 is located in parallel with the end part 15t.

The insulating film 50 contains a material, such as silicon nitride, different from that of the insulating film 44. For instance, the thickness W2 of the insulating film 50 is 50 nanometers or more and 100 nanometers or less.

The insulating film 45 is provided on the insulating film 50. The insulating film 45 contains a material, such as silicon oxide, different from that of the insulating film 50. The insulating film 45 contains e.g. TEOS.

The contact 60 is located on the terrace T of the electrode film 40 and extends in the Z-direction in the staircase-shaped end part 15t. The contact 60 penetrates through the insulating films 45, 50, 44, 41. In the example shown in FIG. 1, the contact 60 is not located on the terrace T of the uppermost electrode film 40.

The lower end of the contact 60 is connected to the electrode film 40, and the upper end is connected to an upper interconnect (not shown) extending in the X-direction. Each electrode film 40 is extracted and connected to the circuit section 70, described later, through the contact 60 and the upper interconnect. The contact 60 contains e.g. a conductive material such as tungsten. The contact 60 is shaped like e.g. a circular column or polygonal prism. The number of contacts 60 and the position of the contact 60 with respect to the terrace T are arbitrary.

Next, the formation position of the insulating film 50 is further described.

Figure 2:
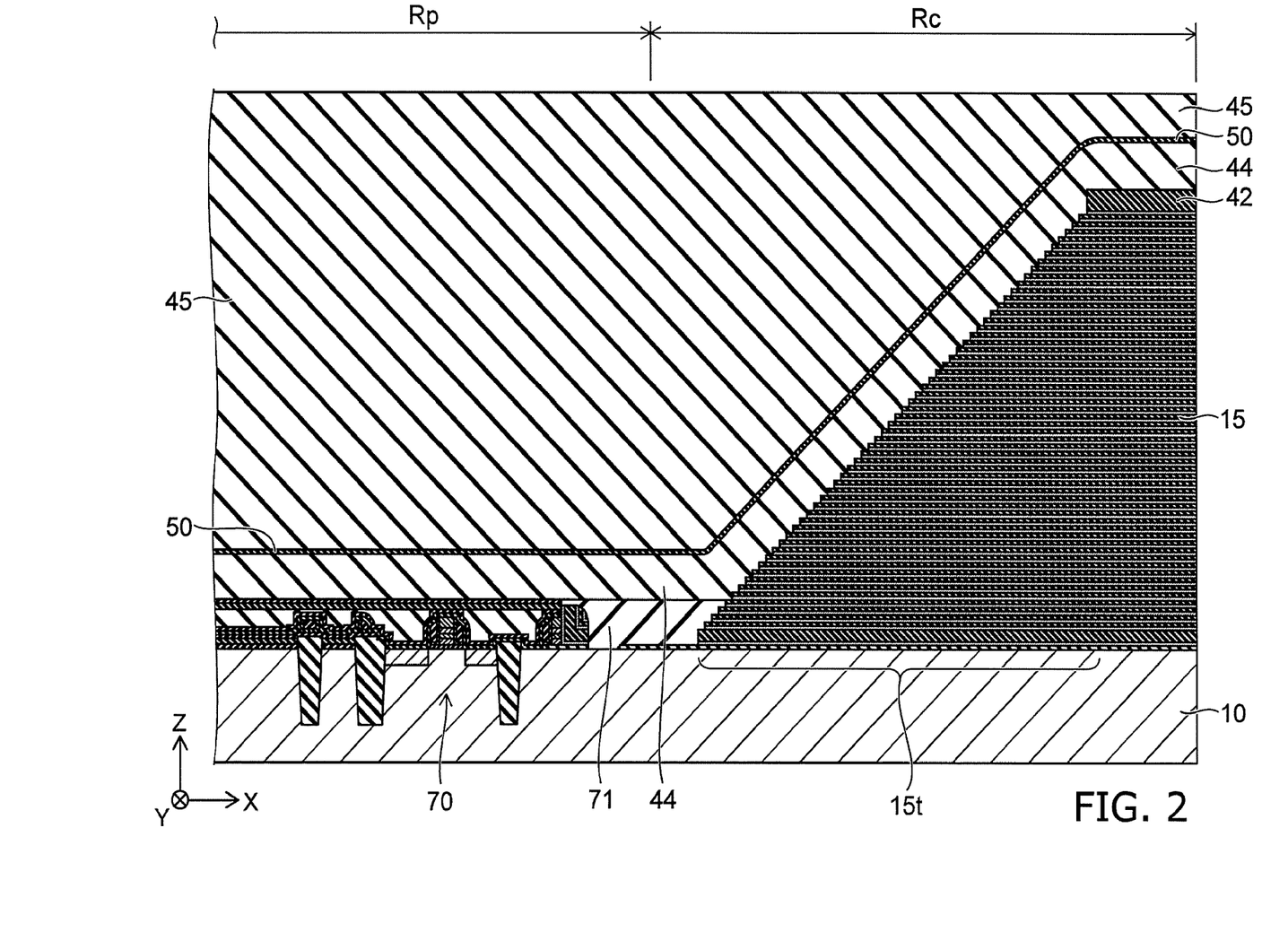
FIG. 2 is a sectional view showing the semiconductor device according to the first embodiment.
Figure 3:
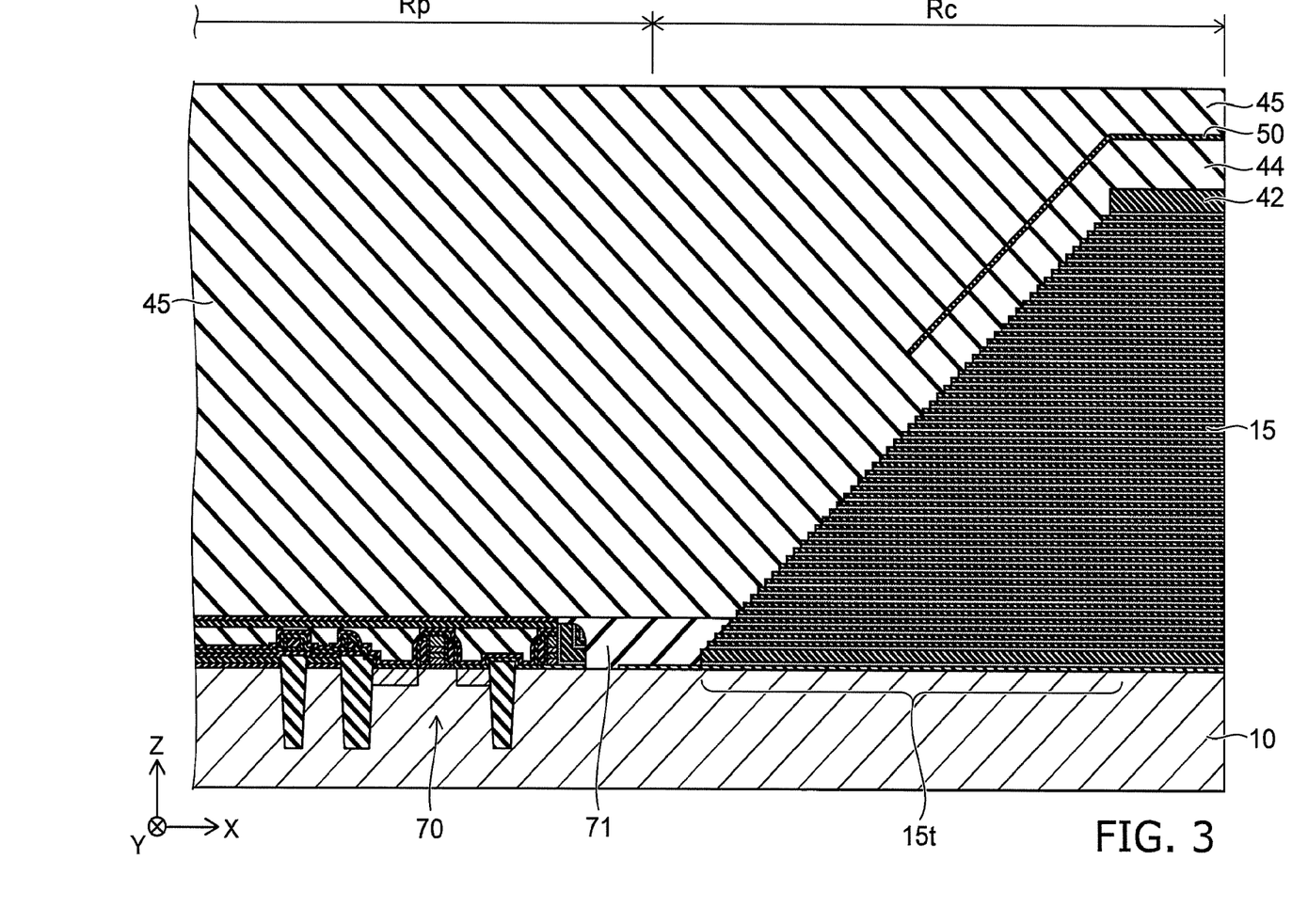
FIG. 3 is a sectional view showing a semiconductor device according to a first variation of the first embodiment.
Figure 4:
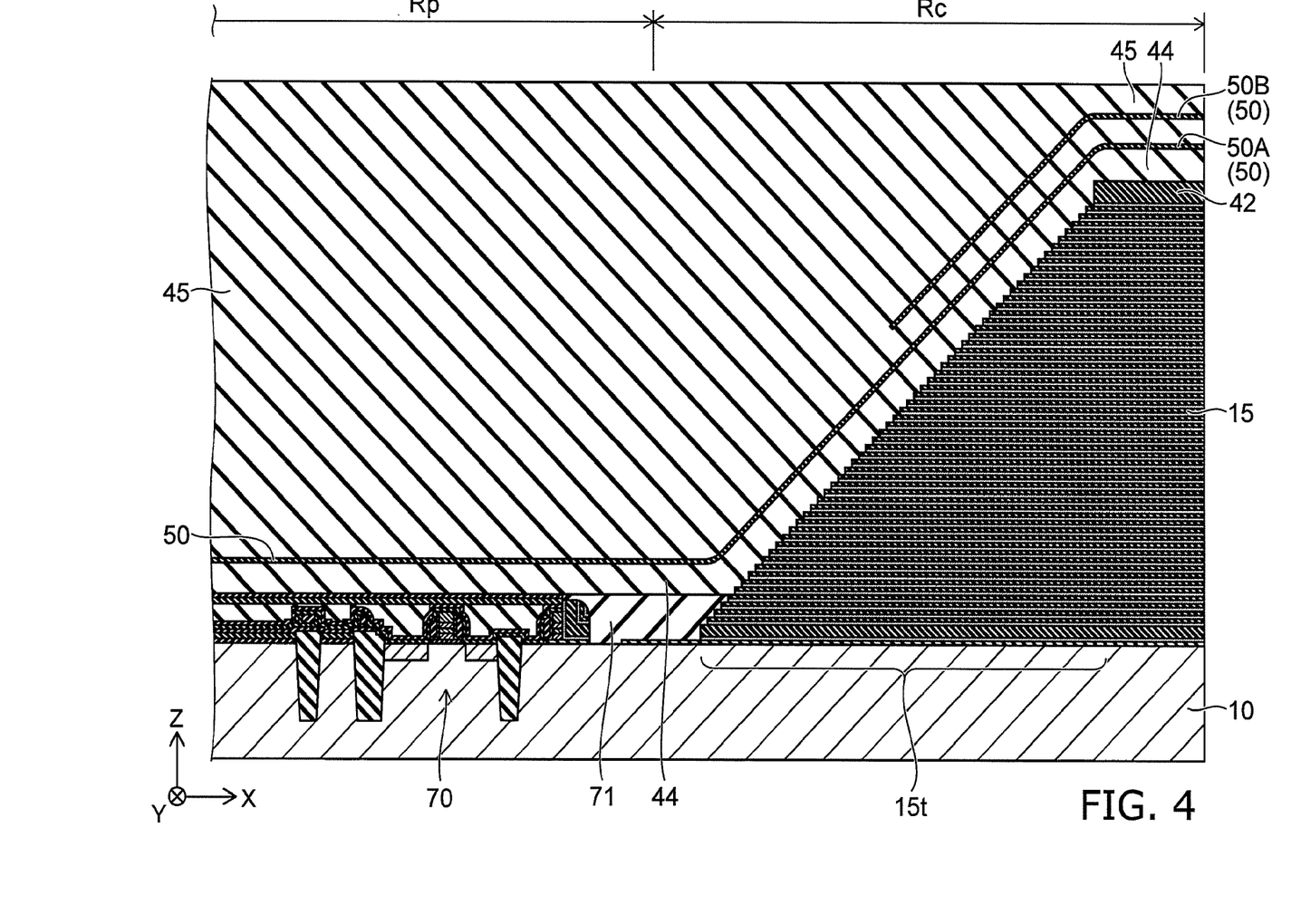
FIG. 4 is a sectional view showing a semiconductor device according to a second variation of the first embodiment.

FIGS. 2 to 4 are sectional views showing the semiconductor device 1. FIGS. 2 to 4 show a region in which the region shown in FIG. 1 is expanded to one side of the X-direction (−X-direction). FIGS. 2 to 4 show an example of the position where the insulating film 50 is formed.

As shown in FIG. 2, the semiconductor device 1 is further provided with a peripheral region Rp. In the example of FIG. 2, the peripheral region Rp is located adjacent to the staircase region Rc in the X-direction. That is, as shown in FIGS. 1 and 2, the peripheral region Rp, the staircase region Rc, and the memory cell region Rm are placed sequentially toward the X-direction.

The peripheral region Rp is provided with a circuit section 70 and an insulating film 71. The circuit section 70 is provided on the substrate 10 and composed of a plurality of transistors. The transistor includes e.g. a channel region, a source region, a drain region, a gate insulating film, and a gate electrode. For instance, the channel region, the source region, and the drain region are separated from the region in the substrate 10 (N-well region and P-well region) by STI (shallow trench isolation) extending in the Y-direction and the Z-direction.

Part of the circuit section 70 is located in the insulating film 71. The insulating film 71 contains e.g. silicon oxide. The insulating film 71 contains e.g. TEOS.

The insulating film 44 is located on the circuit section 70 and the insulating film 71.

As described before, in the staircase region Rc, the insulating film 50 is provided on the insulating film 44 and located along the staircase-shaped end part 15t so that part of the insulating film 50 extends with inclination. As shown in FIG. 2, in the peripheral region Rp, the insulating film 50 is located on the insulating film 44. In the peripheral region Rp, the insulating film 45 is located on the insulating film 50.

As shown in FIG. 2, the insulating film 50 is located on the insulating film 44 in the staircase region Rc and the peripheral region Rp. However, the formation position of the insulating film 50 is not limited thereto.

For instance, as shown in FIG. 3, the insulating film 50 may not be formed in the peripheral region Rp so that the insulating film 50 is located on part of the insulating film 44 in the staircase region Rc. That is, the insulating film 50 is not formed in part of the staircase region Rc corresponding to the lower part of the staircase-shaped end part 15t and in the peripheral region Rp.

The Z-direction width of the contact 60 formed in the upper part of the staircase-shaped end part 15t is smaller than that of the contact 60 formed in the lower part of the staircase-shaped end part 15t. Thus, when a contact hole CH is formed in the upper part of the end part 15t (see FIG. 9), the contact hole CH formed on the terrace T of the electrode film 40 is likely to punch through the electrode film 40 and the directly underlying insulating film 41. Accordingly, the punch-through of the contact hole CH can be partially suppressed by forming an insulating film 50 on the upper part of the end part 15t. The etching selection ratio of the insulating film 50 with respect to the insulating films 44, 45 is preferably such that the contact hole CH formed on the upper part of the staircase-shaped end part 15t has punched through the insulating film 50 when the contact hole CH formed on the lower part of the staircase-shaped end part 15t reaches the terrace T of the electrode film 40.

As shown in FIG. 4, in the staircase region Rc, the insulating film 50 may be further provided in the insulating film 45. In this case, an insulating film 50A is located on the insulating film 44 in the staircase region Rc and the peripheral region Rp, and an insulating film 50B is located in the insulating film 45 in the staircase region Rc. For instance, in the staircase region Rc, the insulating film 50B is located along the staircase-shaped end part 15t so as to overlap part of the insulating film 50A. Use of the formation position of the insulating film 50 as shown in FIG. 4 is preferable in the case where the etching selection ratio of the insulating film 50 with respect to the insulating films 44, 45 is not large.

In the memory cell region Rm, numerous memory cells are arranged in a three-dimensional matrix along the X-direction, the Y-direction, and the Z-direction. Data can be stored in each memory cell. On the other hand, in the staircase region Rc and the peripheral region Rp, each electrode film 40 is extracted from the memory cell region Rm and connected to the circuit section 70 through the contact 60 and the upper interconnect.

Next, a manufacturing method of the semiconductor device according to this embodiment is described.

FIGS. 5, 6A, 6B, 7 to 12 are sectional views showing a manufacturing method of the semiconductor device 1.

Figure 8:
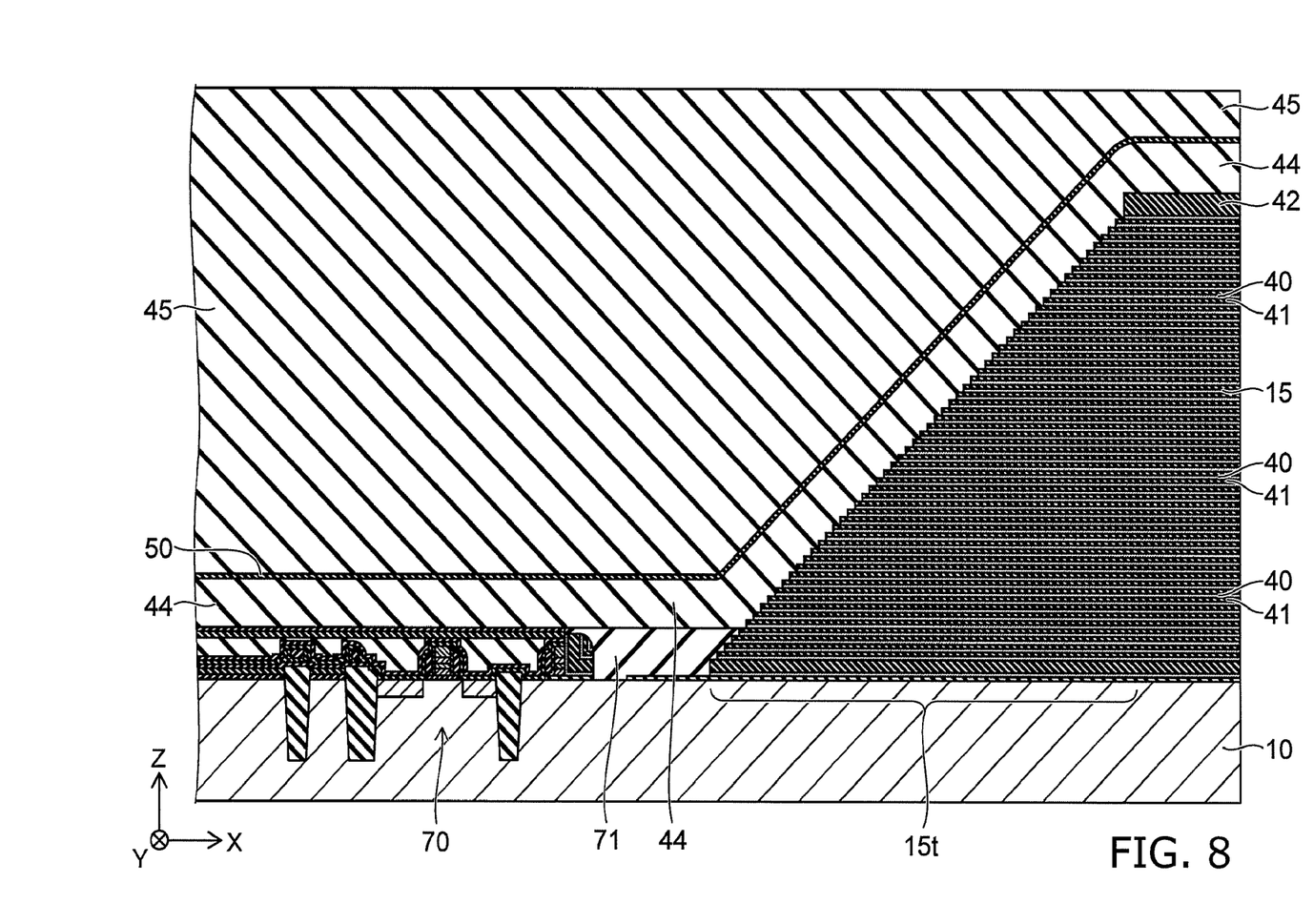
FIG. 8 is a sectional view showing the method for manufacturing the semiconductor device according to the first embodiment.
Figure 9:
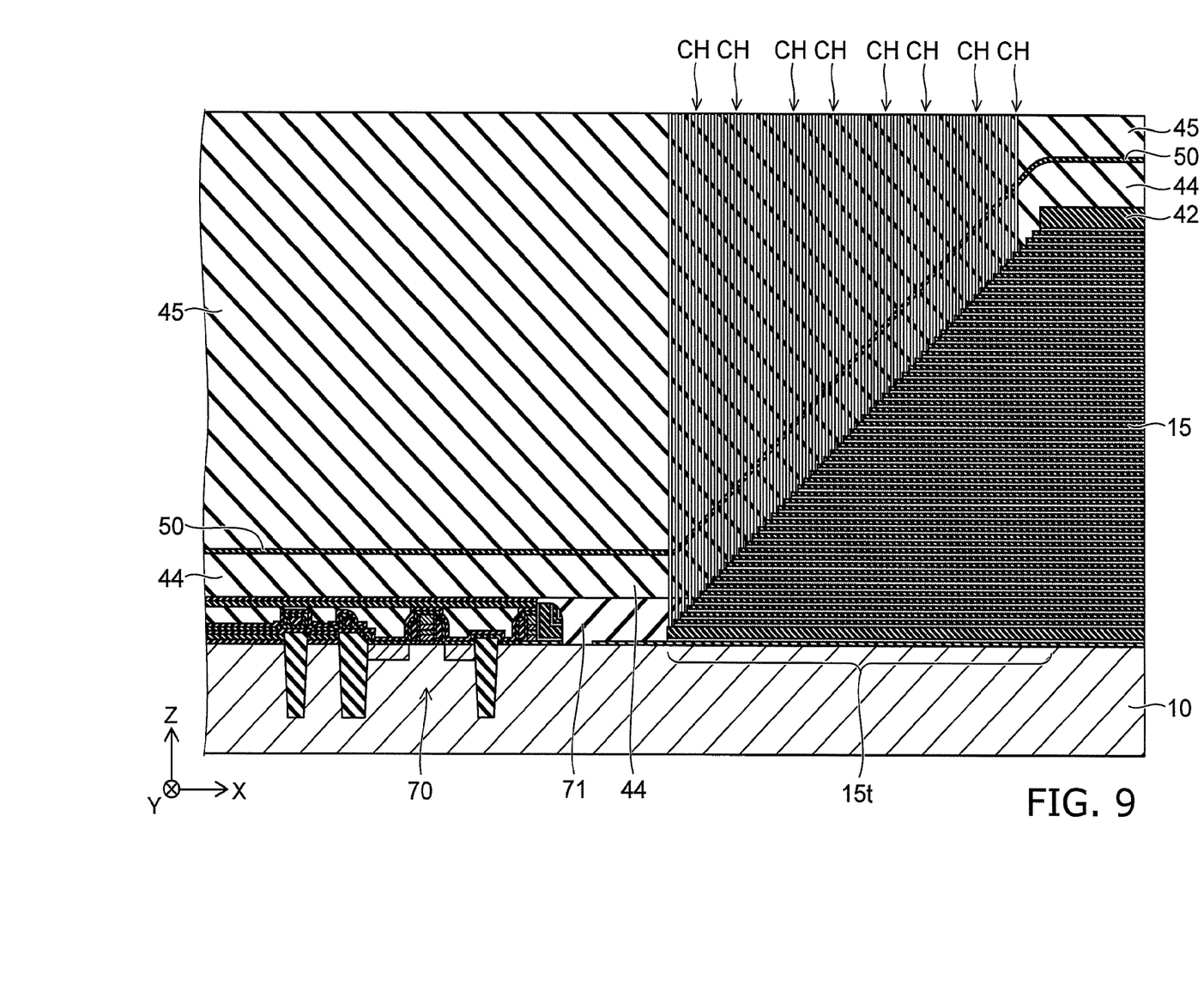
FIG. 9 is a sectional view showing the method for manufacturing the semiconductor device according to the first embodiment.
Figure 10:
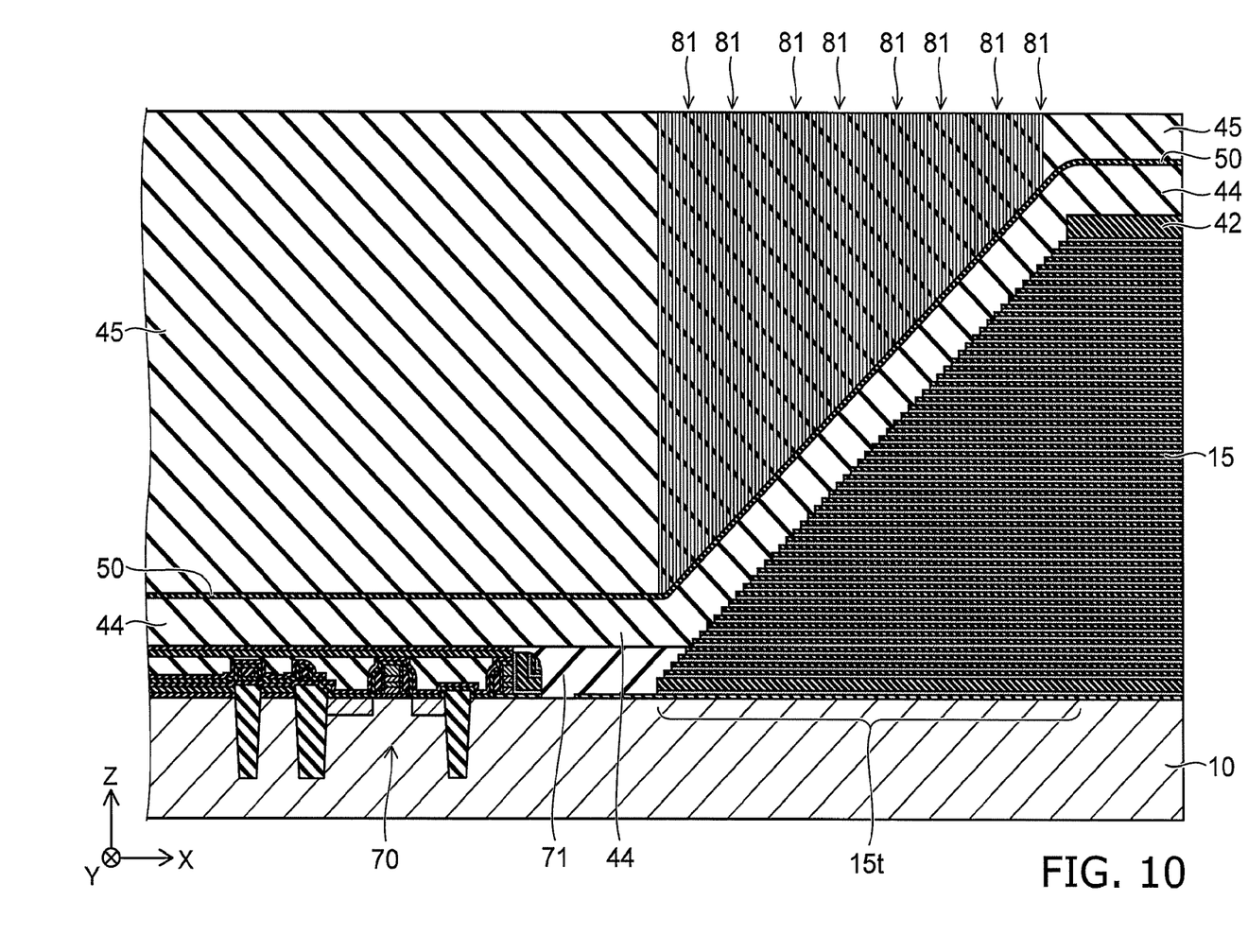
FIG. 10 is a sectional view showing the method for manufacturing the semiconductor device according to the first embodiment.
Figure 11:
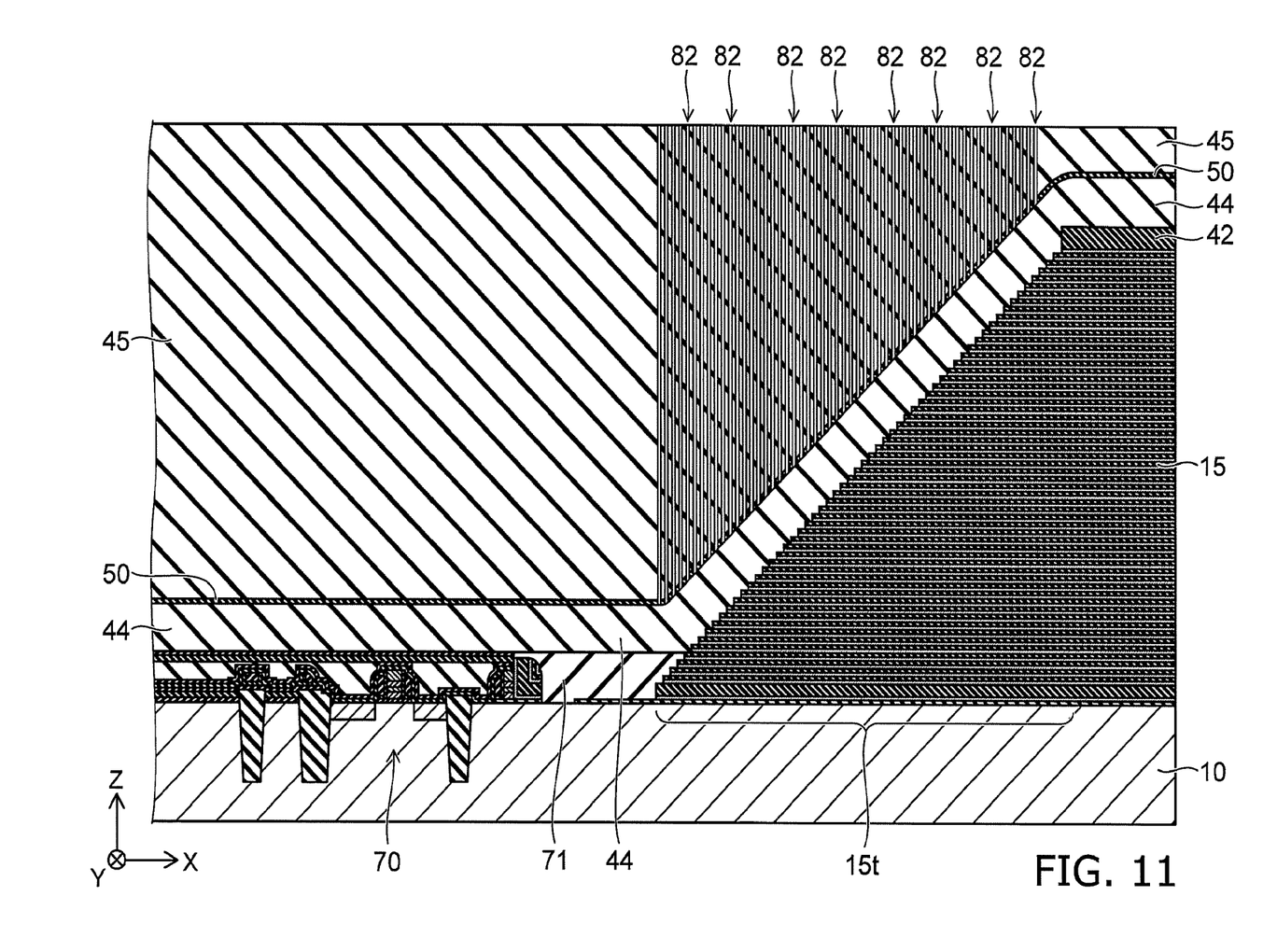
FIG. 11 is a sectional view showing the method for manufacturing the semiconductor device according to the first embodiment.

The region shown in FIGS. 5 and 7 to 12 corresponds to the region shown in FIG. 2. FIGS. 6A and 6B illustrate part of the step shown in FIG. 5. FIGS. 10 and 11 illustrate part of the step shown in FIG. 9. In the following, a manufacturing process of the staircase region Rc and the peripheral region Rp is described.

Figure 5:
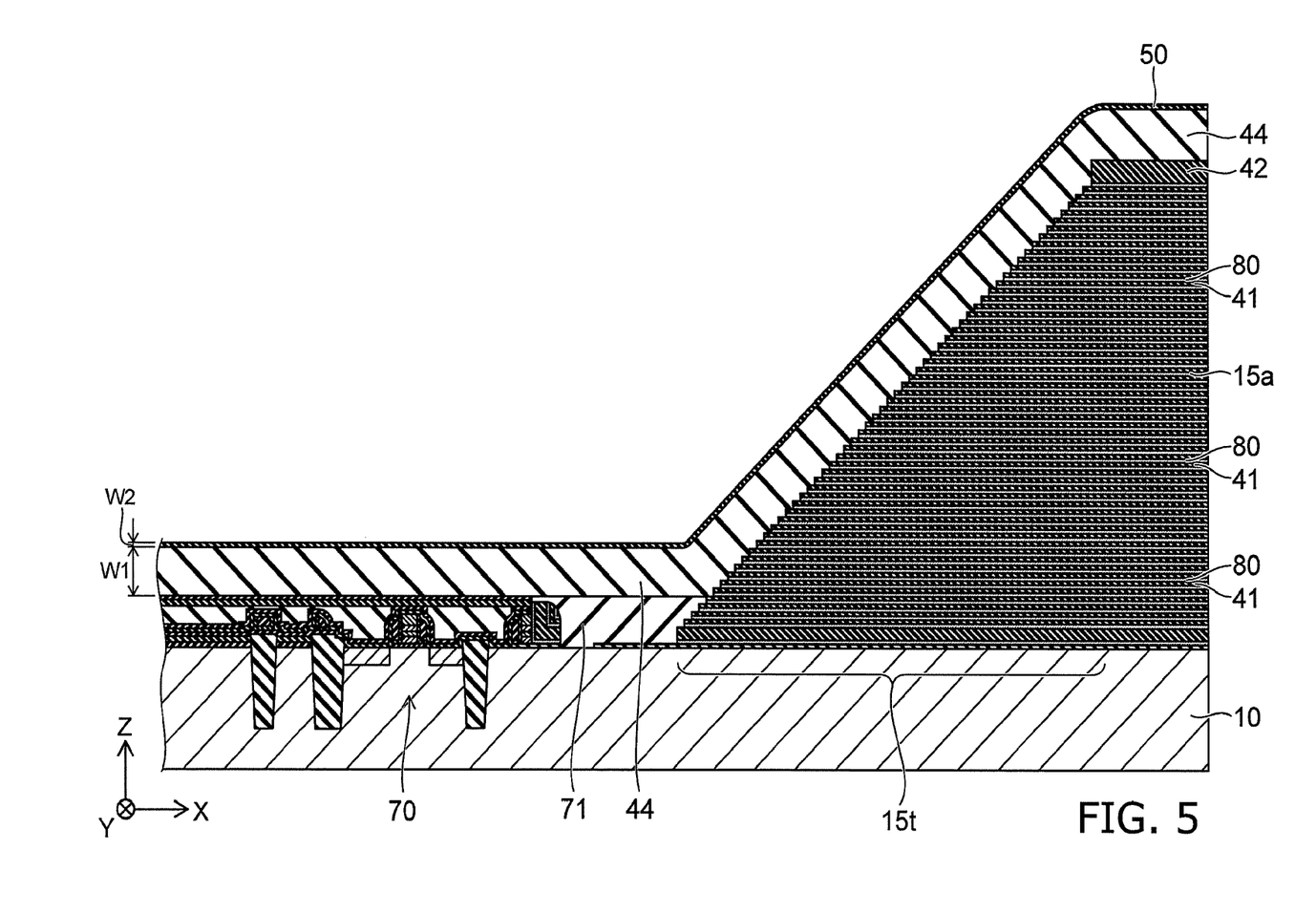
FIG. 5 is a sectional view showing a method for manufacturing the semiconductor device according to the first embodiment.
Figure 6A:
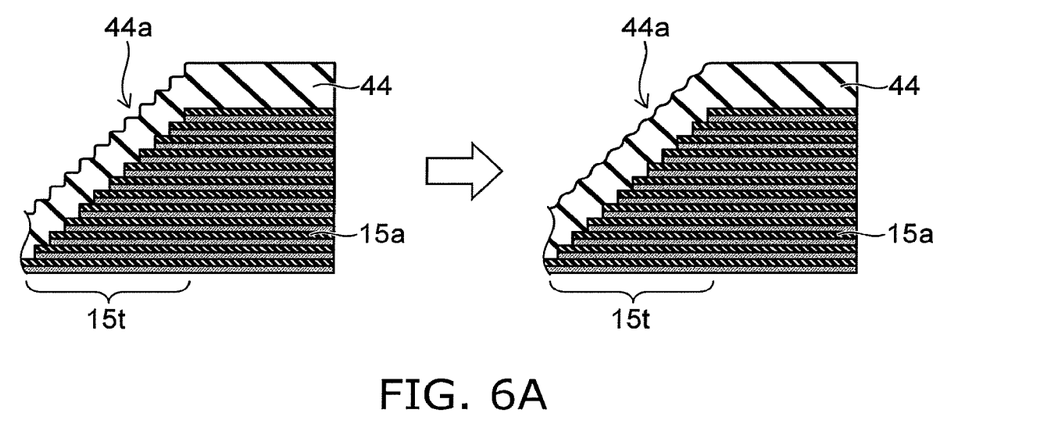
FIG. 6A and FIG. 6B are sectional views showing the method for manufacturing the semiconductor device according to the first embodiment.
Figure 6B:
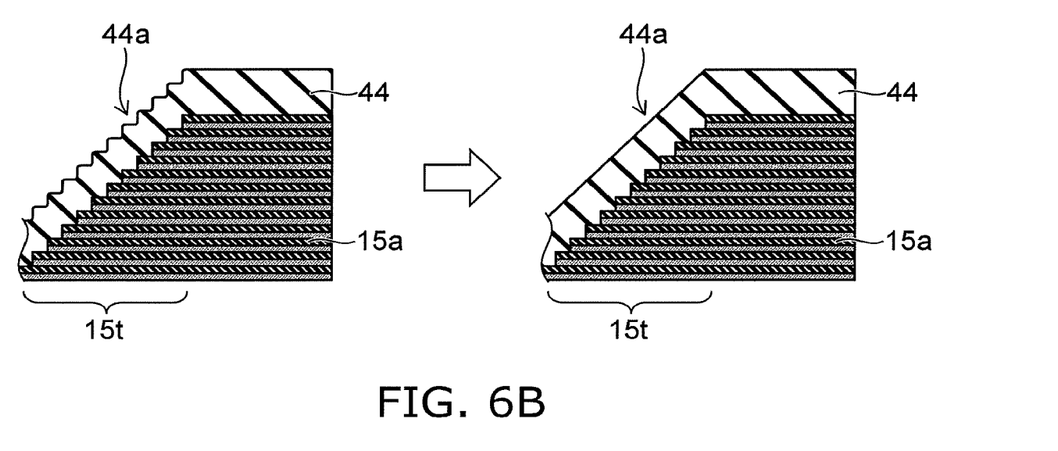

First, as shown in FIG. 5, in the peripheral region Rp, a circuit section 70 and an insulating film 71 are formed on a substrate 10. The circuit section 70 and the insulating film 71 are formed by well-known methods. Subsequently, in the staircase region Rc and the peripheral region Rp, a stacked body 15a is formed by stacking insulating films 41 and sacrificial films 80 alternately along the Z-direction on the substrate 10 by e.g. the CVD (chemical vapor deposition) method. The insulating film 41 is formed from e.g. silicon oxide. The sacrificial film 80 is formed from a material having a sufficient etching selection ratio with respect to the insulating film 41. For instance, the sacrificial film 80 is formed from silicon nitride. Then, an insulating film 42 is formed on the stacked body 15a. The stacked body 15a and the insulating film 42 are formed also in the memory cell region Rm.

Subsequently, in the staircase region Rc, the stacked body 15a formed on the substrate 10 is processed into a staircase shape. Such a staircase-shaped portion is formed by repeating the step of etching a resist film on the stacked body 15a to control the etching amount of the stacked body 15a and then etching the stacked body 15a downward. Thus, the end part 15t of the stacked body 15a formed on the substrate 10 is processed into a staircase shape, and a terrace is formed for each sacrificial film 80.

Subsequently, in the staircase region Rc and the peripheral region Rp, an insulating film 44 is formed on the end part 15t of the stacked body 15a, the circuit section 70, and the insulating film 71 by e.g. the CVD method. The insulating film 44 is formed from e.g. TEOS. The insulating film 44 may be formed from e.g. BPSG (borophosphosilicate glass). For instance, the thickness W1 of the insulating film 44 is approximately 300 nanometers.

As shown in FIG. 6A, in the case of forming the insulating film 44 from TEOS, etching processing such as wet etching is performed after TEOS is formed so as to cover the end part 15t of the stacked body 15a. This can reduce the step difference at the upper surface 44a of the insulating film 44.

As shown in FIG. 6B, in the case of forming the insulating film 44 from BPSG, reflow processing is performed after BPSG is formed so as to cover the end part 15t of the stacked body 15a. This can reduce the step difference at the upper surface 44a of the insulating film 44.

Subsequently, in the staircase region Rc and the peripheral region Rp, an insulating film 50 is formed on the insulating film 44 by e.g. the CVD method. The insulating film 50 is formed from e.g. silicon nitride. In the staircase region Rc, the insulating film 50 is located along the staircase-shaped end part 15t so that part of the insulating film 50 extends with inclination. For instance, the thickness W2 of the insulating film 50 is 50 nanometers or more and 100 nanometers or less.

Figure 7:
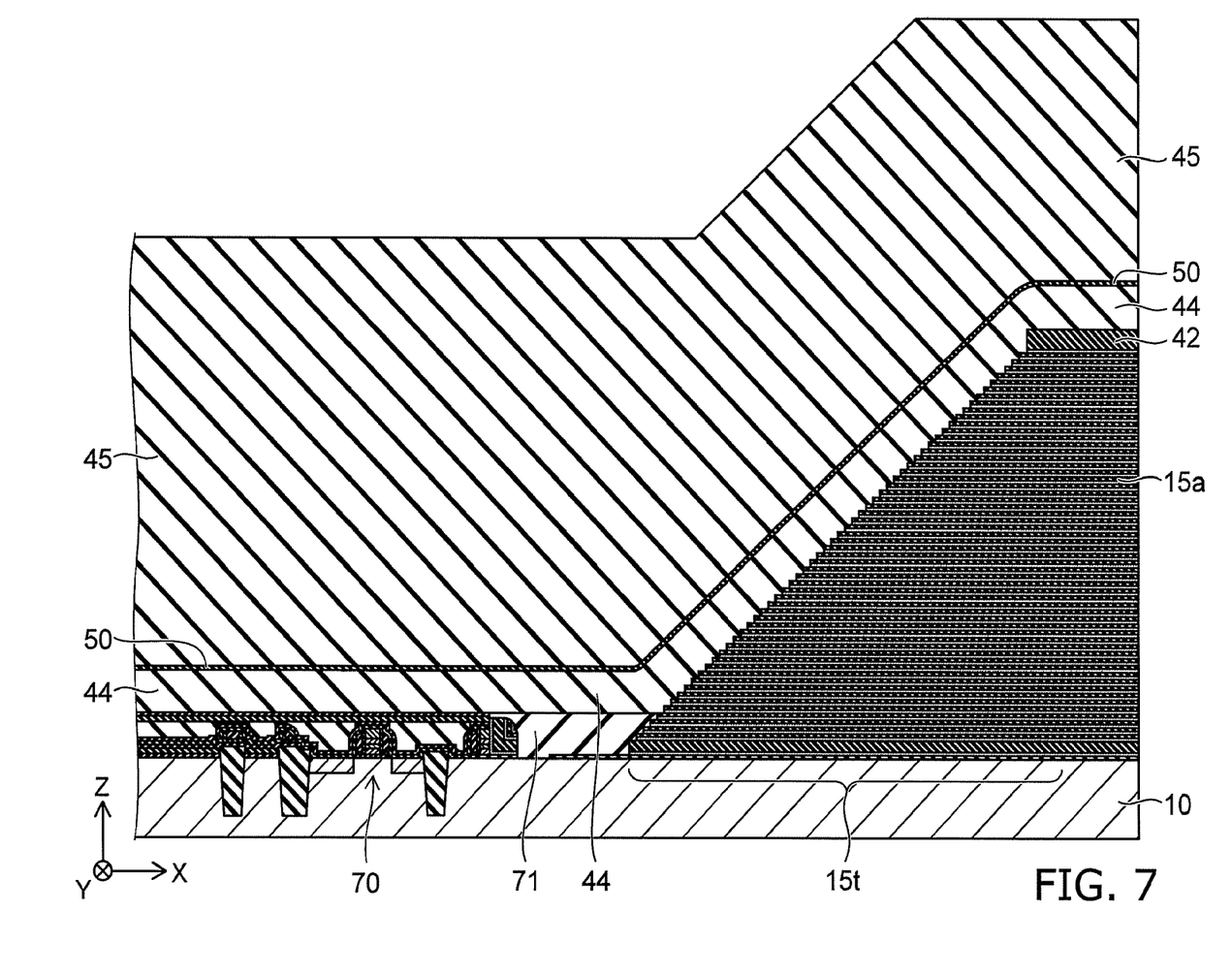
FIG. 7 is a sectional view showing the method for manufacturing the semiconductor device according to the first embodiment.

Next, as shown in FIG. 7, in the staircase region Rc and the peripheral region Rp, by e.g. the CVD method, an insulating film 45 is formed more thickly than the thickest Z-direction position of the insulating film 50. The insulating film 45 is formed from e.g. TEOS.

Next, as shown in FIG. 8, in the staircase region Rc, part of the insulating film 45 is removed to planarize the upper surface by e.g. the CMP (chemical mechanical polishing) method.

In the memory cell region Rm, a plurality of memory holes are formed in the stacked body 15a. Then, a memory film 24 including a tunnel insulating film 21, a charge storage film 22, and a block insulating film 23, a channel 20, and a core part 25 are formed in the memory hole. Thus, a columnar part CL is formed.

In the memory cell region Rm and the staircase region Rc, a plurality of slits extending in the X-direction and the Z-direction are formed in the stacked body 15a. The sacrificial films 80 are removed by performing etching processing such as wet etching through the slits. A void is formed by the removal of the sacrificial films 80. The void is embedded by depositing metal such as tungsten through the slits to form electrode films 40. Thus, a stacked body 15 is formed in which the insulating films 41 and the electrode films 40 are stacked alternately.

The insulating film 50 is not removed in the removal of the sacrificial films 80.

Next, as shown in FIG. 9, in the staircase region Rc, contact holes CH are formed in the insulating film 41 of the stacked body 15 and the insulating films 44, 50, 45 by e.g. etching processing such as RIE. The contact hole CH penetrates through the insulating films 45, 50, 44, 41 to the electrode film 40.

Here, as shown in FIG. 10, the insulating film 50 formed from a material different from that of the insulating film 45 is located below the insulating film 45. Thus, due to the etching selection ratio between the insulating film 45 (e.g. TEOS film) and the insulating film 50 (e.g. silicon nitride film), etching can be stopped without penetration of the hole 81 through the insulating film 50. That is, the insulating film 50 functions as a film for stopping etching. Subsequently, as shown in FIG. 11, part of the insulating film 50 is removed so that the hole 82 reaches the insulating film 44. Then, as shown in FIG. 9, part of the insulating films 44, 41 is removed. Thus, the contact hole CH reaches the electrode film 40.

Figure 12:
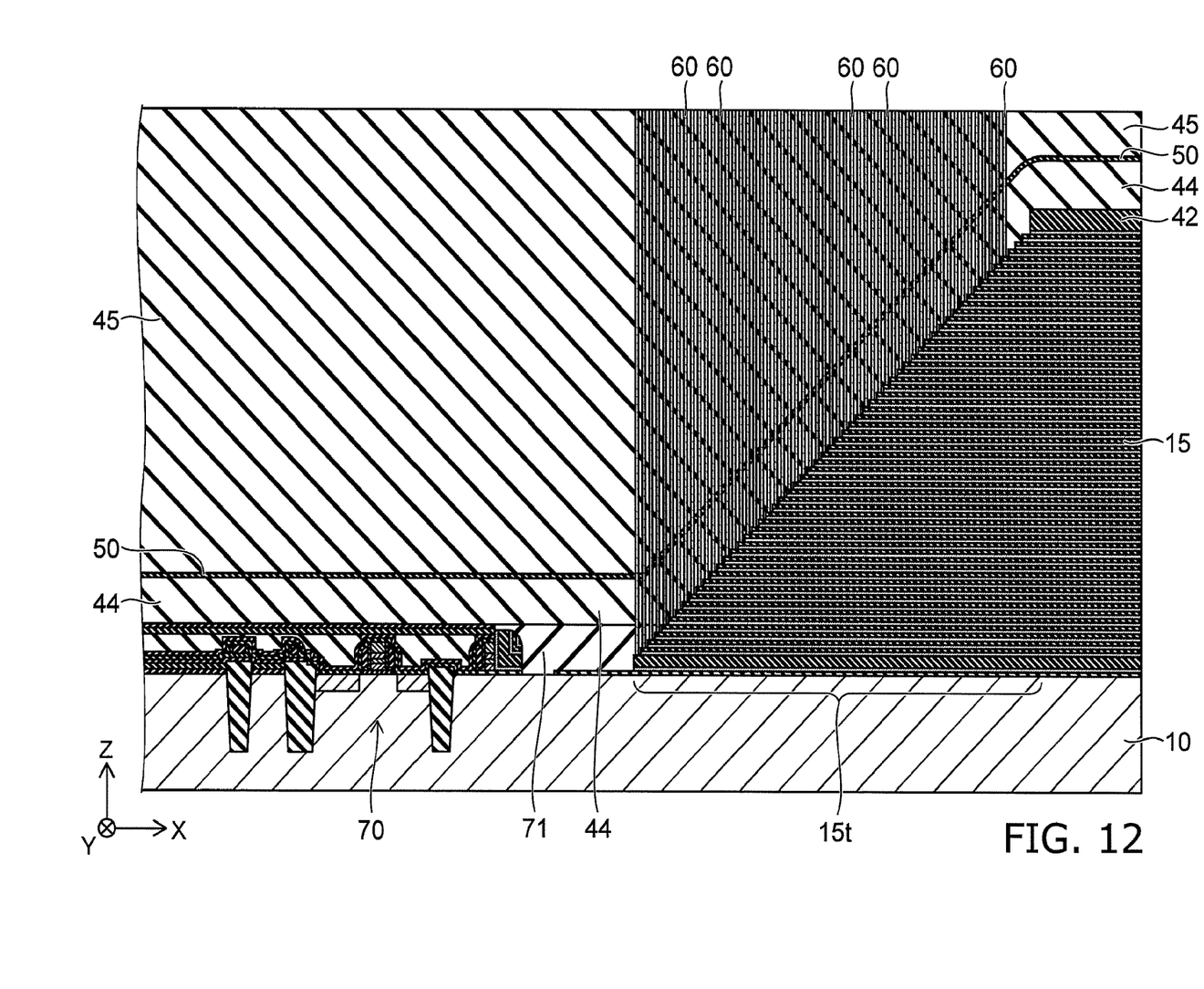
FIG. 12 is a sectional view showing the method for manufacturing the semiconductor device according to the first embodiment.

Next, as shown in FIG. 12, in the staircase region Rc, a contact 60 is formed by depositing metal such as tungsten in the contact hole CH. As shown in FIG. 1, the contact 60 is located on the terrace T of the electrode film 40 in the end part 15t of the stacked body 15 and penetrates through the insulating films 45, 50, 44, 41.

Thus, the semiconductor device 1 is manufactured.

Next, the effect of this embodiment is described.

In a semiconductor memory device with three-dimensional structure, a contact is formed in the end part of the stacked body. In this case, with the increase of the number of stacked electrode films, the thickness of each electrode film may be thinned with the increase of the aspect ratio of the contact hole. Because the end part of the stacked body is shaped like a staircase, the height of the contact hole is different between the upper electrode film and the lower electrode film. Thus, when a plurality of contact holes are formed at once from the upper electrode films to the lower electrode films, with the increase of the number of stacked electrode films, it is difficult to provide a sufficient etching selection ratio between the electrode film and the insulating film on the electrode film. If the etching selection ratio between the electrode film and the insulating film is small, the contact hole formed on the terrace of the electrode film may punch through the electrode film and the directly underlying insulating film. This is likely to cause short circuit between the electrode films.

The semiconductor device 1 of this embodiment includes an insulating film 44 provided on the staircase-shaped end part 15t of the stacked body 15, and an insulating film 50 provided on the insulating film 44 and located along the staircase-shaped end part 15t so that part of the insulating film 50 extends with inclination. Such an insulating film 50 functions as a film for stopping etching as shown in FIG. 9. Thus, the punch-through of the contact hole CH in the electrode film 40 and the directly underlying insulating film 41 can be suppressed compared with the structure without the insulating film 50. This can suppress short circuit between the electrode films 40 due to the punch-through of the contact hole CH.

The semiconductor device 1 of this embodiment includes an insulating film 50 located along the staircase-shaped end part 15t so that part of the insulating film 50 extends with inclination. Thus, the film thickness of the insulating film 50 can be made generally equal with respect to the contact hole CH. This suppresses etching stop due to difference in the film thickness of the insulating film 50 with respect to the contact hole CH.

The semiconductor device 1 of this embodiment includes an insulating film 50 located along the staircase-shaped end part 15t so that part of the insulating film 50 extends with inclination. Thus, a contact hole CH can be formed on the terrace T of the electrode film 40 without affecting the width of the terrace T of the electrode film 40. This suppresses misalignment of the contact hole CH with respect to the terrace T.

This embodiment provides a semiconductor device and a manufacturing method thereof in which a contact can be reliably formed in the staircase-shaped portion of the stacked body without punch-through.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
    a substrate;
    a stacked body provided on the substrate and including a plurality of electrode films stacked with spacing from each other, an end part of the stacked body being shaped like a staircase in which a terrace is formed in each of the plurality of electrode films;
    a first insulating film provided on the end part;
    a second insulating film provided on the first insulating film and located along the end part, at least part of the second insulating film extending with inclination; and
    a plurality of contacts extending in a stacking direction of the plurality of electrode films in the first insulating film and the second insulating film and located on the terraces of the plurality of electrode films,
    an upper surface of the first insulating film being linearly aligned and not traced steps of the staircase, and
    an angle between a side surface of one of the plurality of contacts and the upper surface of the first insulating film and an angle between the side surface of the one of the plurality of contacts and an upper surface of the second insulating film each being a non-right angle.

2. The device according to claim 1, wherein the second insulating film is located in parallel with the end part.

3. The device according to claim 1, wherein an inclination direction of the second insulating film is a direction inclined with respect to both a first direction along an upper surface of the substrate and the stacking direction.

4. The device according to claim 1, wherein the first insulating film covers the end part, and the second insulating film is located on a part of the first insulating film.

5. The device according to claim 1, further comprising:
    a third insulating film provided on the second insulating film; and
    a fourth insulating film provided on the third insulating film and extending with inclination along the end part.

6. The device according to claim 1, wherein the second insulating film contains a material different from that of the first insulating film, the first insulating film contains silicon oxide, and
the second insulating film contains silicon nitride.

7. The device according to claim 1, further comprising:
a circuit section provided on the substrate,
wherein the second insulating film is located in a second region provided with the circuit section, the second region being adjacent to a first region provided with the end part.

8. The device according to claim 7, further comprising:
a columnar part provided in the stacked body, located in a third region, and including a channel, the first region being located between the second region and the third region.

9. A semiconductor device comprising:
a substrate;
a stacked body provided on the substrate and including a plurality of electrode films stacked with spacing from each other in a first direction and extending in a second direction crossing the first direction, an end part of the stacked body being shaped like a staircase in which a terrace is formed in each of the plurality of electrode films;
a first insulating film provided on the end part;
a second insulating film provided on the first insulating film and extending in a third direction inclined with respect to both the first direction and the second direction; and
a plurality of contacts extending in the first direction in the first insulating film and the second insulating film and located on the terraces of the plurality of electrode films,
an upper surface of the first insulating film being linearly aligned and not traced steps of the staircase, and
an angle between a side surface of one of the plurality of contacts and the upper surface of the first insulating film and an angle between the side surface of the one of the plurality of contacts and an upper surface of the second insulating film each being a non-right angle.

10. The device according to claim 9, wherein the second insulating film is located along the end part.

11. The device according to claim 9, wherein the second insulating film is located in parallel with the end part.

12. The device according to claim 9, wherein the third direction is a direction inclined with respect to a direction along an upper surface of the substrate.

13. The device according to claim 9, wherein the first insulating film covers the end part, and the second insulating film is located on a part of the first, insulating film.

14. The device according to claim 9, further comprising:
a third insulating film provided on the second insulating film; and
a fourth insulating film provided on the third insulating film and extending in the third direction.

15. The device according to claim 9, wherein
the second insulating film contains a material different from that of the first insulating film,
the first insulating film contains silicon oxide, and
the second insulating film contains silicon nitride.

16. The device according to claim 9, further comprising:
a circuit section provided on the substrate,
wherein the second insulating film is located in a second region provided with the circuit section, the second region being adjacent to a first region provided with the end part.

17. The device according to claim 16, further comprising:
a columnar part provided in the stacked body, located in a third region, and including a channel, the first region being located between the second region and the third region.

18. A method for manufacturing a semiconductor device, comprising:
forming a stacked body by alternately stacking first insulating films and first films on a substrate;
processing an end part of the stacked body into a staircase shape by removing a part of the stacked body;
forming a second insulating film on the end part of the stacked body, the second insulating film covering the end part;
planarizing an upper surface of the second insulating film to be linearly aligned and not traced steps of the staircase:
forming a third insulating film on the second insulating film, at least part of the third insulating film extending with inclination along the end part of the stacked body;
forming a fourth insulating film on the third insulating film; and
forming a through hole penetrating through the first insulating film, the second insulating film, the third insulating film, and the fourth insulating film on the end part of the stacked body.

19. The method according to claim 18, further comprising:
forming a slit in the stacked body after forming the fourth insulating film; and
removing the first film through the slit and forming a conductive film in the removed portion,
wherein the through hole is formed on a terrace of the conductive film in the end part of the stacked body.

20. The method according to claim 18, wherein the planarizing an upper surface of the second insulating film includes performing etching processing to the upper surface of the second insulating film.

21. The method according to claim 18, wherein the planarizing an upper surface of the second insulating film includes performing reflow processing to the second insulating film.

* * * * *